US009143151B2

(12) United States Patent
Park

(10) Patent No.: US 9,143,151 B2
(45) Date of Patent: Sep. 22, 2015

(54) PULSE GENERATOR AND ANALOG-DIGITAL CONVERTER INCLUDING THE SAME

(71) Applicant: Electronics and Telecommunications Research Institute, Daejeon (KR)

(72) Inventor: Ji Man Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/259,007

(22) Filed: Apr. 22, 2014

(65) Prior Publication Data

US 2014/0354460 A1    Dec. 4, 2014

(30) Foreign Application Priority Data

May 28, 2013  (KR) .......................... 10-2013-0060497

(51) Int. Cl.
*H03M 1/12* (2006.01)
*H03M 1/18* (2006.01)
(52) U.S. Cl.
CPC ....................................... *H03M 1/18* (2013.01)
(58) Field of Classification Search
CPC ............. G06F 1/04; G06F 1/06; G06F 1/105;
G06F 7/164; G06F 7/588; H03F 3/085;
H03K 3/84; H04B 1/7174; H04B 1/71632;
A61N 1/306; A61N 1/325; A61N 1/327

USPC .......... 375/146, 238, 295, 130; 327/291, 164, 327/165, 299, 94, 172, 138; 341/155–160
See application file for complete search history.

(56) References Cited

U.S. PATENT DOCUMENTS

| | | | |
|---|---|---|---|
| 6,392,396 B1 * | 5/2002 | Hubler | 324/72 |
| 6,542,014 B1 * | 4/2003 | Saito | 327/164 |
| 6,753,931 B2 * | 6/2004 | Kane et al. | 348/742 |
| 7,057,417 B2 * | 6/2006 | Okuno | 326/99 |
| 7,233,187 B2 * | 6/2007 | Vig | 327/291 |
| 7,633,241 B2 * | 12/2009 | Lu et al. | 315/291 |
| 7,990,305 B2 | 8/2011 | Park et al. | |
| 8,064,131 B2 * | 11/2011 | Vigroux et al. | 359/348 |
| 8,204,097 B2 * | 6/2012 | Oh et al. | 375/138 |
| 8,305,128 B2 * | 11/2012 | Nakazawa et al. | 327/291 |

FOREIGN PATENT DOCUMENTS

| | | |
|---|---|---|
| JP | 2011-097269 A | 5/2011 |
| KR | 10-0901694 B1 | 6/2009 |

* cited by examiner

*Primary Examiner* — Lam T Mai

(57) ABSTRACT

Provided is a pulse generator. The pulse generator includes: a pulse generation unit receiving an analog signal and generating a first pulse signal in response to a comparison result of a voltage level applied to a first node and a reference voltage according to the received analog signal; a pulse amplification unit generating a second pulse signal having a wider pulse width than the first pulse signal according to a comparison result of a voltage level applied to a second node and a ground voltage, in response to the first pulse signal; and a gate logic outputting a final pulse signal as a signal for digital conversion by performing a logic operation on the first and second pulse signals.

12 Claims, 11 Drawing Sheets

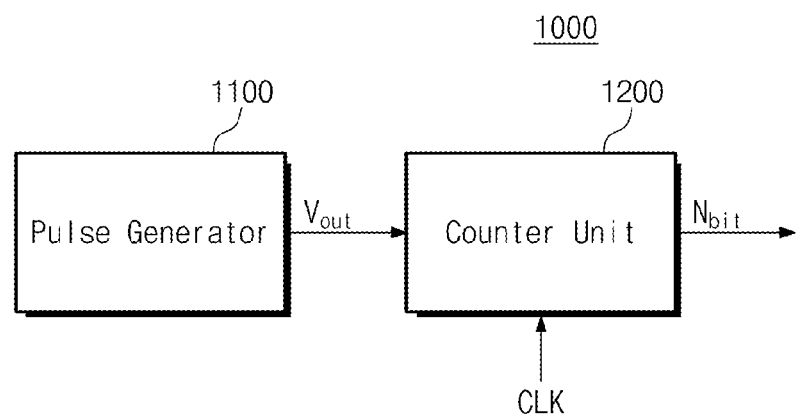
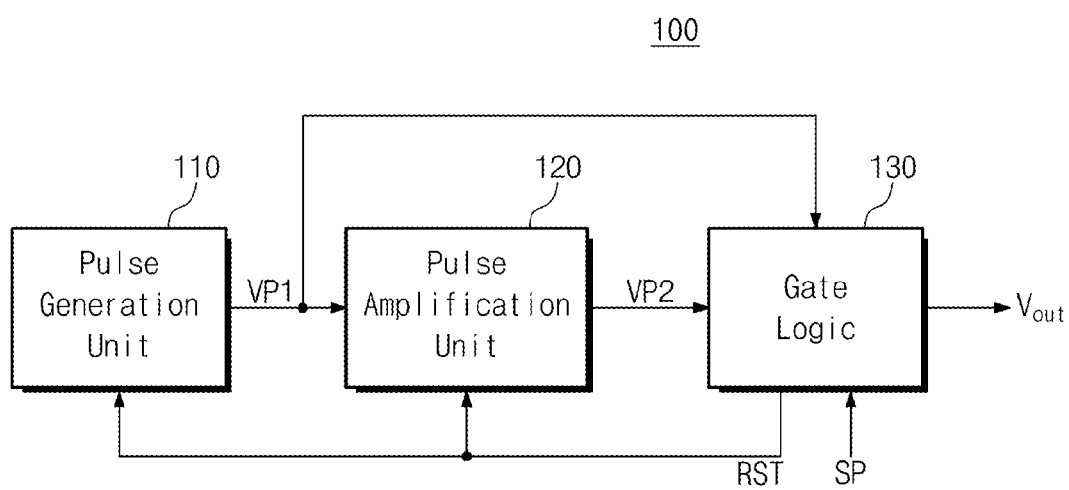

PULSE GENERATOR AND ANALOG-DIGITAL CONVERTER INCLUDING THE SAME

CROSS-REFERENCE TO RELATED APPLICATIONS

This U.S. non-provisional patent application claims priority under 35 U.S.C. §119 of Korean Patent Application No. 10-2013-0060497, filed on May 28, 2013, the entire contents of which are hereby incorporated by reference.

BACKGROUND OF THE INVENTION

The present invention disclosed herein relates to an analog-digital (A/D) converter, and more particularly, to a pulse generator amplifying a pulse width about an analog signal and an A/D converter including the same.

An A/D converter is a device or circuit for converting an analog signal into a digital signal. Recently, the A/D converter is used for a mobile phone, a digital camera, and a semiconductor chip.

As an existing A/D converter, a double integral A/D converter using an operational amplifier (OP-AMP) has been used. In order to implement an existing A/D converter with a semiconductor chip, the capacity of a capacitor used for integral needs to be set larger. However, if the capacity of a capacitor becomes larger, the area of a semiconductor chip becomes larger also. Accordingly, a high-resolution pulse generator with a capacitor having a small capacity is required.

SUMMARY OF THE INVENTION

The present invention provides a high-resolution pulse generator with a capacitor having a small capacity and an analog-digital (A/D) converter including the same.

Embodiments of the present invention provide pulse generators including: a pulse generation unit receiving an analog signal and generating a first pulse signal in response to a comparison result of a voltage level applied to a first node and a reference voltage according to the received analog signal ; a pulse amplification unit generating a second pulse signal having a wider pulse width than the first pulse signal according to a comparison result of a voltage level applied to a second node and a ground voltage, in response to the first pulse signal; and a gate logic outputting a final pulse signal as a signal for digital conversion by performing a logic operation on the first and second pulse signals, wherein after a level of the first pulse signal is shifted, the pulse amplification unit amplifies a pulse width of the second pulse signal for a predetermined time until the a voltage level of the second node reaches the ground voltage.

In other embodiments of the present invention, pulse generators includes: a pulse generation unit generating a pulse signal in response to an analog signal provided from a sensor; a multi-pulse generator outputting a plurality of divided pulse signals in response to the pulse signal; and a gate logic selecting one pulse signal from among the plurality of divided pulse signals and outputting a final pulse signal generated on the basis of a logic operation on the selected pulse signal as a signal for digital conversion.

In still other embodiments of the present invention, A/D converters include: a sensor; a pulse generator generating a first pulse signal in response to an analog signal detected from the sensor and outputting a second pulse signal having a wider pulse width than the first pulse signal by delaying the generated first pulse signal by a predetermined time; and a counter outputting the second pulse signal as a digital signal in response to a clock signal.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 1 is a block diagram illustrating an A/D converter according to an embodiment of the present invention;

FIG. 2 is a block diagram illustrating a pulse generator according to an embodiment of the present invention;

DETAILED DESCRIPTION OF PREFERRED EMBODIMENTS

Figure 3:
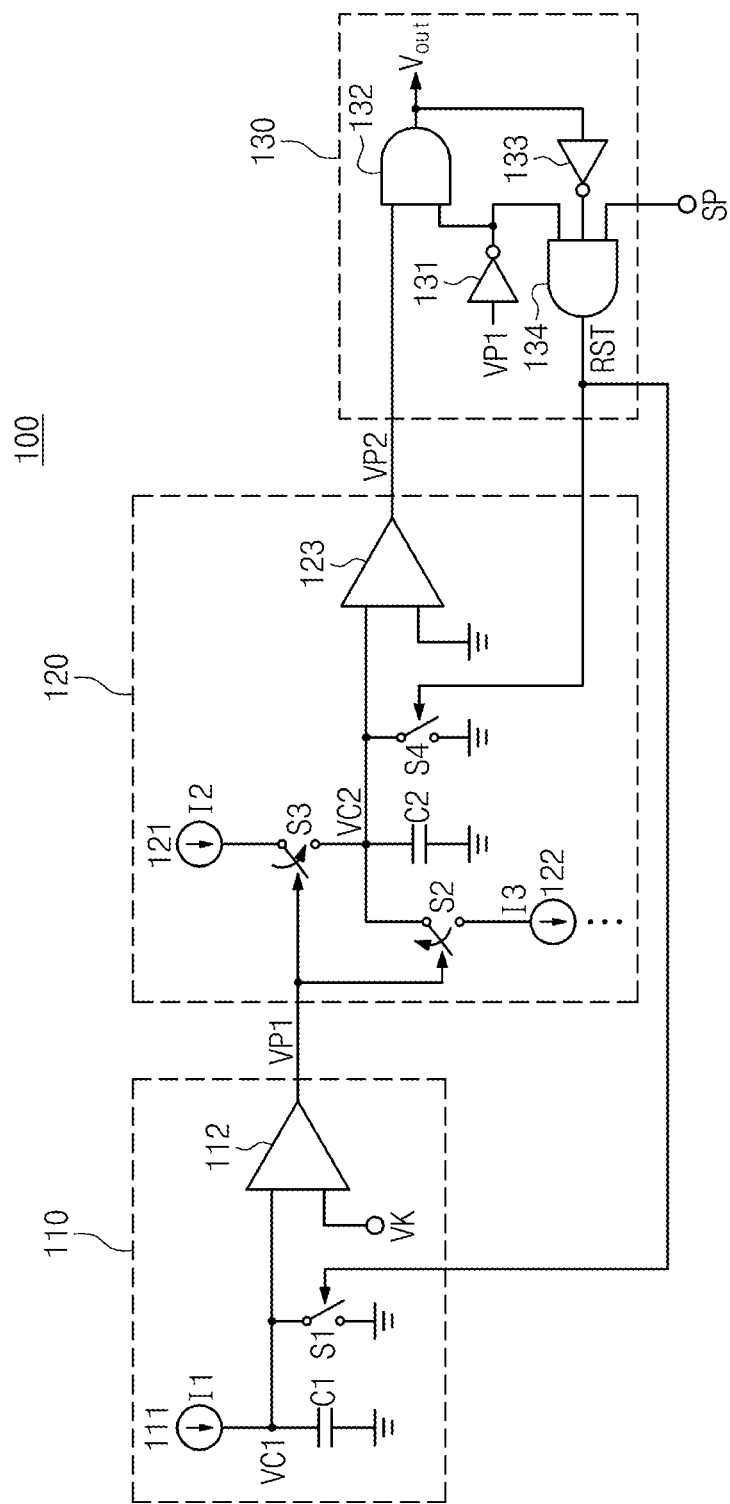
FIG. 3 is a circuit diagram illustrating the pulse generator shown in FIG. 2.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements. An analog-digital (A/D) converter according to an embodiment of the present invention and operations performed thereby are exemplarily described. Various modifications and changes are possible within the scope not departing from the technical ideas of the present invention.

Hereinafter, it will be described about an exemplary embodiment of the present invention in conjunction with the accompanying drawings.

FIG. 1 is a block diagram illustrating an A/D converter according to an embodiment of the present invention. Referring to FIG. 1, the A/D converter 1000 includes a pulse generator 1100 and a counter unit 1200.

The pulse generator 1100 detects a physical change of a sensor and converts the detected physical change into an electrical analog signal. The sensor may include a temperature sensor, a humidity sensor, an acceleration sensor, and a pressure sensor. The pulse generator 1100 converts the converted analog signal into a pulse signal according to a time difference. The pulse generator 1100 delivers a final pulse signal Vout according to a time difference to the counter unit 1200.

When a physical change value of a device or a sensor is small, an existing pulse generator may not change a dynamic range of a pulse greatly. Accordingly, an existing pulse generator may change a pulse width by adjusting a level of a voltage charged in a capacitor. A method of adjusting a voltage level of a capacitor includes a method of increasing the capacity of a capacitor or reducing a current applied to a capacitor.

For example, an existing pulse generator may amplify a dynamic range of a pulse by reducing a current applied to a capacitor. However, if a current applied to a capacitor is small, noise occurs. Additionally, in order to implement a pulse generator with a chip, the capacity of a capacitor needs to be manufactured small. However, if the capacity of a capacitor is small, the dynamic range of a pulse is small so that high-resolution conversion may not be performed.

Accordingly, the pulse generator 1100 amplifies a dynamic range of a pulse by using a pulse amplification unit and a multi-pulse generator instead of setting a dynamic range of a pulse according to the capacity and voltage level of a capacitor. The counter unit 1200 receives a final pulse signal Vout outputted from the pulse generator 1100. The counter unit 200 converts the final pulse signal Vout into an N bit digital signal in response to a clock signal CLK received from the outside.

FIG. 2 is a block diagram illustrating a pulse generator according to an embodiment of the present invention. Referring to FIG. 2, the pulse generator 1100 includes a pulse generation unit 110, a pulse amplification unit 120, and a gate logic 130.

The pulse generator 110 converts a physical change value of a sensor changing according to an external environment in to an analog signal. According to an embodiment of the present invention, a sensor is implemented in a form of a capacitor or a resistor and is included in the pulse generation unit 110. The pulse generation unit 110 generates a first pulse signal VP1 according to a predetermined time difference in response to the converted analog signal.

The pulse generation unit 110 delivers the first pulse signal VP1 generated according to a predetermined time difference to each of the pulse amplification unit 120 and the gate logic 130. Additionally, the pulse generation unit 110 may perform a reset operation by receiving a reset signal RST from the gate logic 130.

The pulse amplification unit 120 receives the first pulse signal VP1 from the pulse generation unit 110. The pulse amplification unit 120 generates a second pulse signal VP2 in response to the received first pulse signal VP1. According to an embodiment of the present invention, the second pulse signal VP2, as a signal having a wider pulse width than the first pulse signal VP1, may be a signal obtained by extending the first pulse signal VP1 for a predetermined time.

The amplification unit 120 delivers the generated second pulse signal VP2 to the gate logic 130 according to a predetermined time difference. The pulse amplification unit 120 may perform a reset operation by receiving a reset signal RST from the gate logic 130.

The gate logic 130 receives the first and second pulse signals VP1 and VP2 from the pulse generation unit 110 and the pulse amplification unit 120, respectively. The gate logic 130 performs a logic operation on the received first and second pulse signals VP1 and VP2. The gate logic 130 may output a final pulse signal Vout on the basis of a result of the logic operation.

Moreover, the gate logic 130 receives a start pulse signal SP from the outside. The gate logic 130 generates a reset signal RST for resetting the pulse generation unit 110 and the pulse amplification unit 120 in response to the start pulse signal SP. Upon receiving the reset signal RST from the gate logic 130, the pulse generation unit 110 and the pulse amplification unit 120 perform a reset operation.

FIG. 3 is a circuit diagram illustrating the pulse generator shown in FIG. 2. Referring to FIG. 3, the pulse generation unit 110 includes a first current source 111, a first capacitor C1, a first switch S1, and a first comparator 112.

In more detail, the first current source 111 applies a first reference current I1 to a first node VC1. The first capacitor C1 is connected between the first node VC1 and a ground terminal, and a voltage is charged in the first capacitor C1 according to a current applied to the first node VC1. According to an embodiment of the present invention, according to a charge amount of the first capacitor C1, a physical movement of a sensor may be determined. For example, if a physical movement of a sensor is small, the first capacitor C1 changes a low level of voltage.

The first comparator 112 receives a voltage from each of the first node VC1 and the reference terminal After comparing a voltage level of the first capacitor C1 and a level of a reference voltage VK, the first comparator 112 outputs the first pulse signal VP1 according to a comparison result.

A first switch S1 is connected between the first node VC1 and the ground terminal, and is turned on in response to the reset signal RST received from the gate logic 130. As the first switch S1 is turned on, a voltage charged in the first capacitor C1 may be discharged.

The pulse amplification unit 120 includes a second current source 121, a third current source 122, a second switch S2, a third switch S3, a fourth switch S4, a second capacitor C2, and a second comparator 123.

When the third switch S3 is turned on, the second current source 121 applies a second reference current I2 to a second node VC2. When the second switch S2 is turned on, the third current source 122 discharges a voltage charged in the second capacitor C2 in response to a third reference current I3.

The second capacitor C2 is connected between the second node VC2 and a ground terminal and has a voltage level applied to the second node VC2.

The second switch S2 is connected between the second node VC2 and the third current source 122. The third switch S3 is connected between the second current source 121 and the second node VC2. The second and third switches S2 and S3 may operate in response to the first pulse signal VP1 outputted from the first comparator 112. In more detail, when the third switch S3 is turned on, the second current source 12 is applied to the second node VC2. On the contrary, when the second switch S2 is turned on, a voltage charged in the second capacitor C2 is discharged in response to the third reference current I3.

According to an embodiment of the present invention, the second and third switches S2 and S3 operate complementarily. For example, while the second switch S2 is turned on, the third switch S3 is turned off.

The second comparator 123 receives a voltage from each of the second node VC2 and the ground terminal After comparing a voltage level of the second capacitor C2 and a level of a ground voltage, the second comparator 123 outputs a second pulse signal VP2 according to a comparison result.

The fourth switch S4 is connected between the second node VC2 and the ground terminal and is turned on in response to the reset signal RST received from the gate logic 130. As the fourth switch S4 is turned on, a voltage charged in the first capacitor C2 is discharged.

According to an embodiment of the present invention, the pulse amplification unit 120 may adjust a voltage level of the second node VC2 in response to the third reference current I3. The pulse amplification unit 120 may amplify the width of the second pulse signal VP2 outputted through the second comparator 123 by adjusting a voltage level of the second node VC2.

The gate logic 130 includes a first inverter 131, a first logic operation unit 132, a second inverter 133, and a second logic operation unit 134.

The first inverter 131 receives the first pulse signal VP1 from the pulse generation unit 110 and outputs the received first pulse signal VP1 as an inverted signal The first logic operation unit 132 receives the inverted first pulse signal VP1 from the first inverter 131 and the second pulse signal VP2 from the pulse amplification unit 120. According to an embodiment of the present invention, the first logic operation unit 132 may operate as an And gate. The first logic operation unit 132 outputs a final pulse signal Vout according to a logic operation result of the inverted first pulse signal VP1 and the second pulse signal VP2.

The second inverter 133 receives the final pulse signal Vout outputted from the first logic operation unit 132 and outputs it as an inverted signal. The second inverter 133 delivers the inverted final pulse signal Vout to the second logic operation unit 134.

The second logic operation 134 receives the inverted first pulse signal VP1 from the first inverter 131, and receives the inverted final pulse signal Vout from the second inverter 133. Additionally, the second logic operation unit 134 receives a start pulse signal SP from the outside. According to an embodiment of the present invention, the second logic operation unit 134 may operate as an And gate. The first logic operation unit 132 outputs a reset signal RST generated based on a logic operation on the inverted first pulse signal VP1, the inverted final pulse signal Vout, and the start pulse signal SP.

Figure 4:
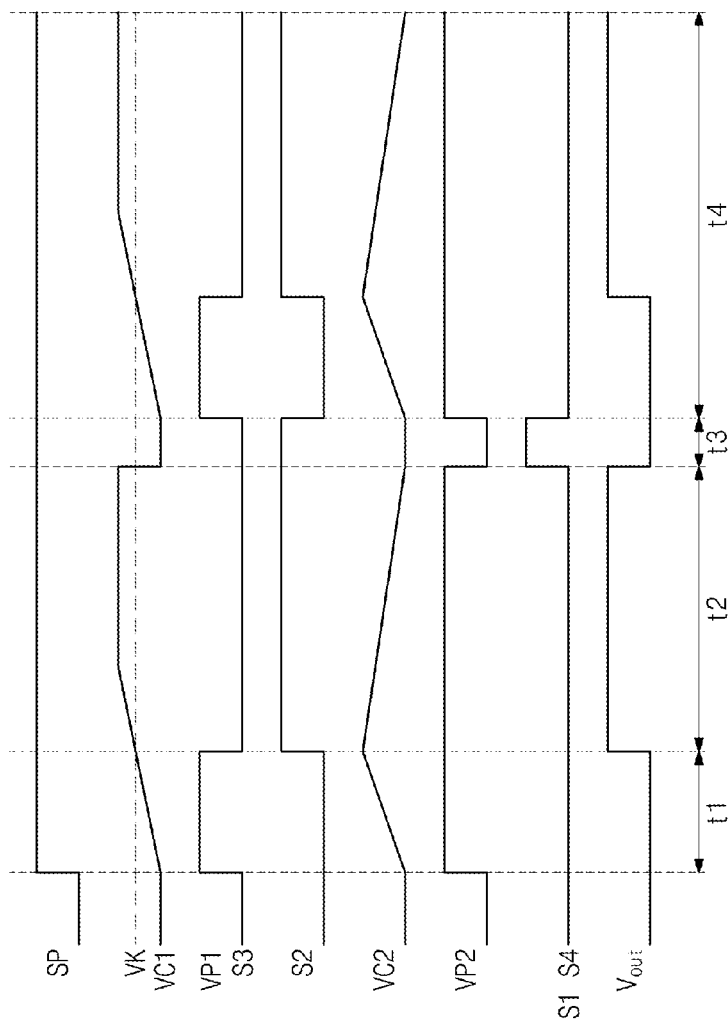
FIG. 4 is a timing diagram illustrating an operation of the pulse generator shown in FIG. 3.

FIG. 4 is a timing diagram illustrating an operation of the pulse generator shown in FIG. 3. Referring to FIGS. 3 and 4, at the first timing t1, as the first reference current I1 is applied from the first current source 111 to the first node VC1, a voltage level of the first node VC1 starts increasing. In response to a voltage level of the first node VC1, a voltage is charged in the first capacitor C1. The first comparator 122 compares a voltage level of the first node VC1 and a level of a reference voltage VK. The first comparator 112 outputs the first pulse signal VP1 of a high level until the voltage level of the first node VC1 reaches the level of the reference voltage VK.

Additionally, as the first comparator 112 outputs the first pulse signal VP1 of a high level, the third switch S3 is turned on. Accordingly, as the second reference current I2 is applied from the second current source 121 to the second node VC2, a voltage level of the second node VC2 starts increasing. In response to a voltage level of the second node VC2, a voltage may be charged in the second capacitor C2.

The second comparator 123 compares a voltage level of the second node VC2 and a level of the ground voltage. Until the voltage level of the second node VC2 reaches the level of the ground voltage, the second comparator 123 outputs the second pulse signal VP2 of a high level.

At the second timing t2, as the voltage level of the first node VC1 reaches the reference voltage VK, the first comparator 112 outputs the first pulse signal VP1 of a low level. Accordingly, the third switch S3 is turned off and the second switch S2 is turned on. As the second switch S2 is turned on, a voltage level of the second node VC2 starts decreasing in response to the third reference current I3.

Until the voltage level of the second node VC2 reaches a ground voltage, the second comparator 123 outputs the second pulse signal VP2 of a high level continuously. Additionally, the first logic operation unit 132 outputs a final pulse signal Vout generated based on a logic operation of the inverted first pulse signal VP1 and the second pulse signal VP2.

The final pulse signal Vout may be a common pulse signal of the inverted first pulse signal VP1 and the second pulse signal VP2. In more detail, since the second pulse signal VP2 is generated based on the first pulse signal VP1, the second pulse signal VP2 includes the first pulse signal VP1. Accordingly, through the first logic operation unit 132, a time of the first pulse signal VP1 included in the second pulse signal VP2 may be removed.

At the third timing t3, as a voltage level of the second node VC2 reaches a ground level, the second comparator 123 outputs the second pulse signal VP2 of a low level. As the second pulse signal VP2 of a low level is outputted, the first logic operation unit 132 outputs the final pulse signal Vout of a low level.

Additionally, the second logic operation unit 134 outputs a reset signal RST to reset the pulse generation unit 110 and the pulse amplification unit 120. In more detail, the second logic operation unit 134 receives the inverted first pulse signal VP1, the inverted final pulse signal Vout, and the start pulse signal SP. The second logic operation unit 134 outputs a reset signal RST through a logic operation of signals. The first to fourth switches S1 and S4 are turned on for a predetermined time in response to the reset signal. Accordingly, a voltage charged in the first and second capacitors C1 and C2 is discharged into the ground terminal.

From the fourth timing t4, the operations of the first to third timings t1 to t3 are repeatedly performed. As mentioned above, the pulse generator 100 may amplify a dynamic range of the first pulse signal VP1 through the pulse amplification unit 120.

Figure 5:
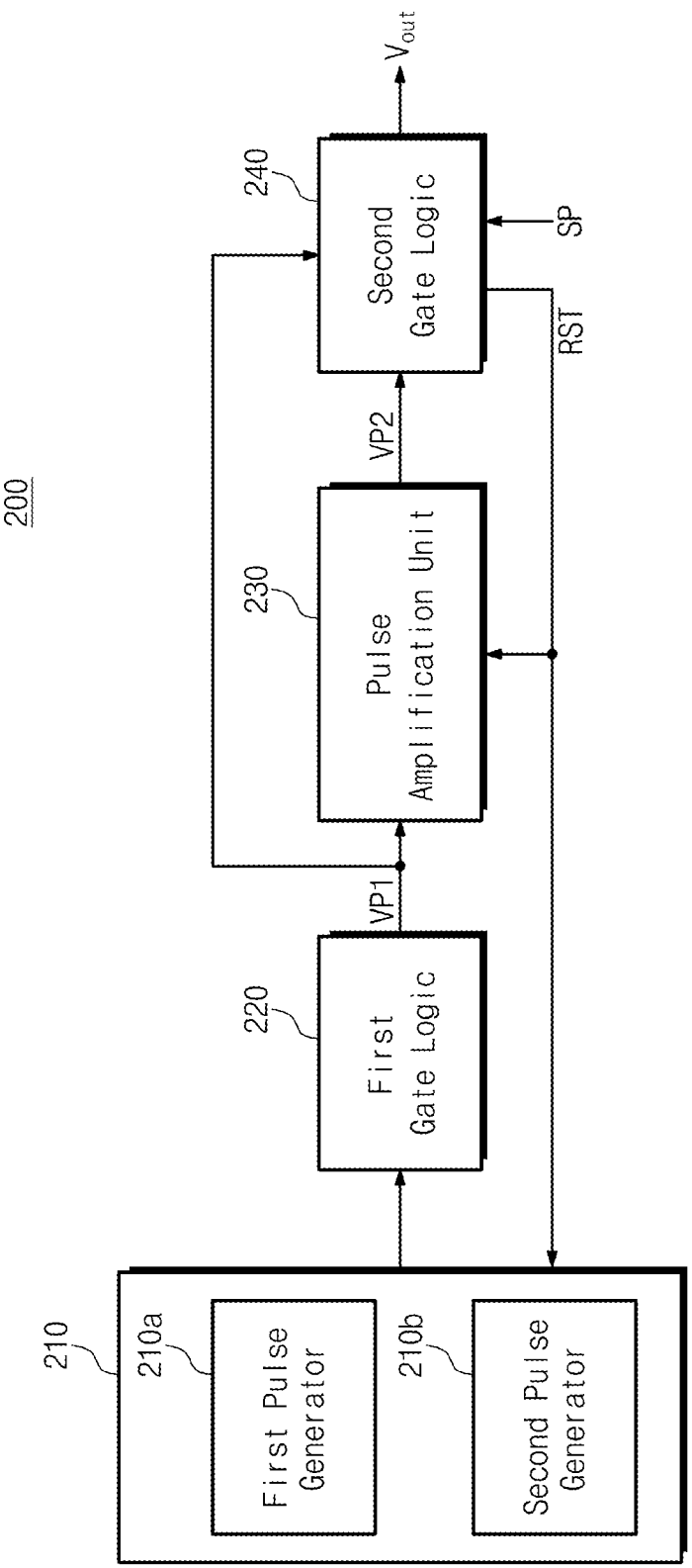
FIG. 5 is a block diagram illustrating a pulse generator according to a second embodiment of the present invention.

FIG. 5 is a block diagram illustrating a pulse generator according to a second embodiment of the present invention. Referring to FIG. 5, the pulse generator 200 includes a first pulse generator 210a, a second pulse generator 210b, a first gate logic 220, a pulse amplification unit 230, and a second gate logic 240.

Compared to the pulse generator 100 of FIG. 2 according to the first embodiment of the present invention, the pulse generator 200 according to the second embodiment of the present invention may further increase the accuracy of an output value.

In more detail, the pulse generator 200 may determine a final change amount of a sensor by comparing the change amounts of a first sensor and a second sensor. At least one of the first and second sensors may be a reference sensor. The pulse generator 200 may obtain an accurate output value for a sensor value by performing a logic operation on the change amounts of the first and second sensors. As a logic operation method, a method of differentiating each change amount outputted from sensors may be provided.

For example, the pulse generator 200 may output a final pulse signal according to a physical change amount of a humidity sensor. However, the final pulse signal may include noise for a temperature change in addition to a physical change amount of a humidity sensor. Accordingly, the accuracy of the final pulse signal may become less. The pulse generator 200 may output the final pulse signal wherein noise for a temperature change is cancelled by using a reference sensor.

The first pulse generation unit 210 includes a first pulse generator 210a and a second pulse generator 210b. For example, the first and second pulse generators 210a and 210b determine each physical movement of humidity. According to an embodiment of the present invention, the second pulse generator 201b may be a reference sensor for comparing an output value of the first pulse generator 210a. When measuring a physical change amount of humidity, the first and second pulse generators 210a and 210b may include the same noise signal for a temperature change. The first and second pulse generators 210a and 210b deliver a pulse signal for physical movement from each sensor to the first gate logic 210.

The first gate logic 220 may perform a logic operation on each pulse signal received from the first and second pulse generators 210a and 210b. The first gate logic 220 may be a comparison gate logic for performing a comparison operation on output values of the first and second pulse generators 210a and 210b. According to an embodiment of the present invention, the first gate logic 220 may use a method of differentiating an output value of each pulse signal, as a logic operation method. At this point, according to a logic operation performed by the first gate logic 220, noise signals for a temperature change included in the output signals of the first and second pulse generators 210a and 220b may be cancelled each other.

Accordingly, an accurate pulse signal for a humidity sensor may be obtained. The first gate logic 220 may deliver the first pulse signal VP1 on which a logic operation is performed to each of the pulse amplification unit 230 and the second gate logic 240.

The pulse amplification unit 230 receives the first pulse signal VP1 from the first gate logic 220. The pulse amplification unit 230 generates a second pulse signal VP2 in response to the received first pulse signal VP1. According to an embodiment of the present invention, the second pulse signal VP2, as a signal having a wider pulse width than the first pulse signal VP1, may be a signal obtained by extending the first pulse signal VP1 for a predetermined time. The pulse amplification unit 230 delivers the second pulse signal VP2 having an amplified pulse width to the second gate logic 240.

The second gate logic 240 performs a logic operation on the first and second pulse signals VP1 and VP2. The second gate logic 240 outputs a final pulse signal Vout according to a logic operation result.

Additionally, the second gate logic 240 receives a start pulse signal SP from the outside. The second gate logic 240 generates a reset signal RST for resetting the first and second pulse generators 210a and 210b and the pulse amplification unit 230 in response to the start pulse signal SP. Upon receiving the reset signal RST from the second gate logic 240, the first and second pulse generators 210a and 210b and the pulse amplification unit 230 perform a reset operation.

Figure 6:
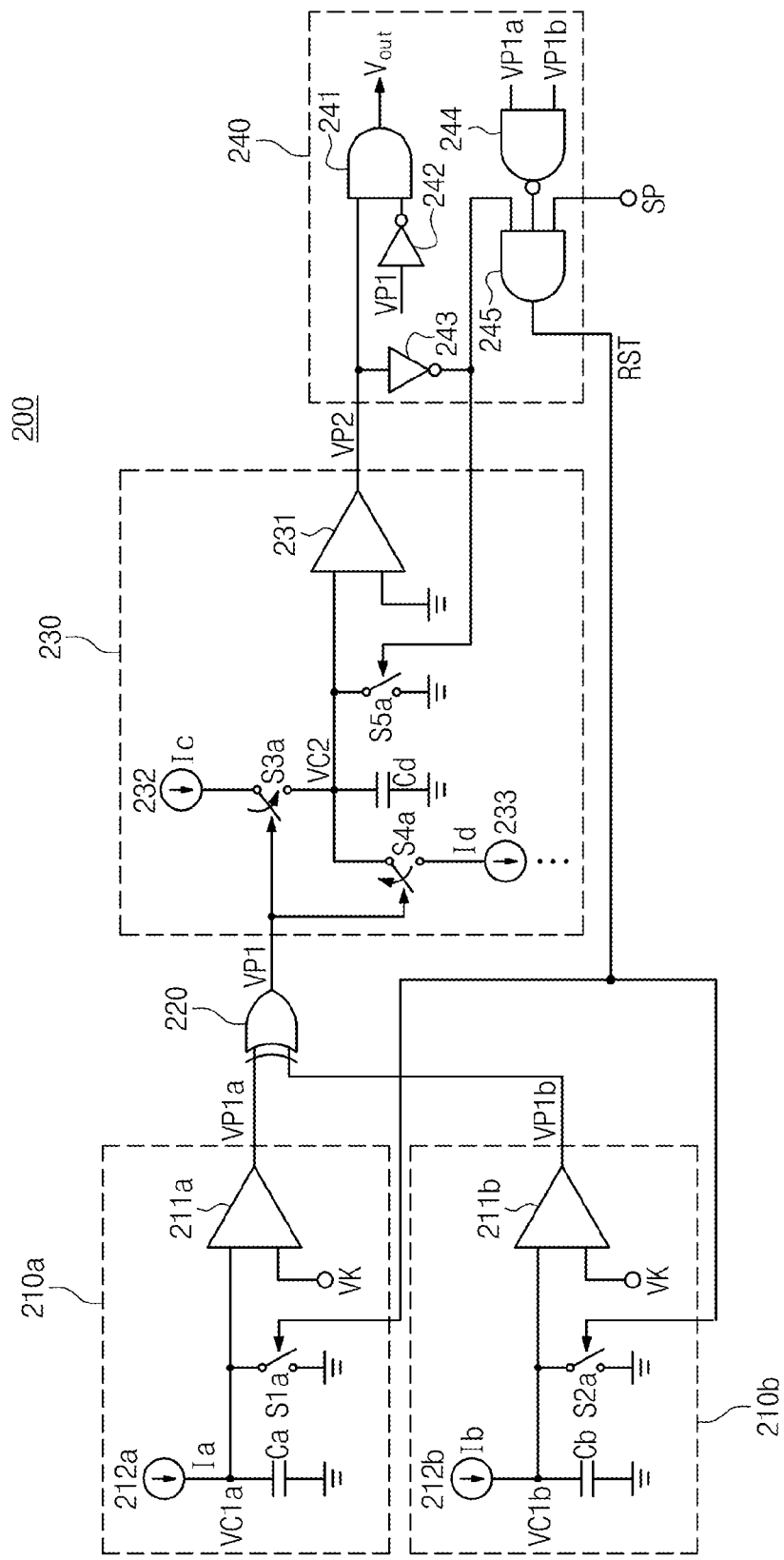
FIG. 6 is a circuit diagram illustrating the pulse generator shown in FIG. 5.

FIG. 6 is a circuit diagram illustrating the pulse generator shown in FIG. 5. Referring to FIG. 6, a first pulse generator 210a includes a first capacitor Ca, a first switch S1a, a first comparator 211a, and a first current source 212a.

A second pulse generator 210b includes a second capacitor Cb, a second switch S2a, a second comparator 211b, and a second current source 212b. Each of the first and second pulse generators 210a and 210b may be implemented with the same structure and operation as the first pulse generation unit 110 shown in FIG. 3.

Additionally, according to an embodiment of the present invention. Through the first and second capacitors Ca and Cb, a physical change amount of a sensor may be determined For example, through the first capacitor Ca, a physical change amount of a humidity sensor may be determined. The first pulse generator 210a outputs a first compare pulse signal VP1a through the first comparator 211a in response to a change of a humidity sensor.

Through the second capacitor Cb, a physical change amount of a humidity sensor according to a reference value may be determined. The second pulse generator 210b outputs a second compare pulse signal VP1b through the second comparator 211b in response to a change of a humidity sensor according to a reference value.

Moreover, according to an embodiment of the present invention, the first and second pulse generators 210a and 210b may output first and second compare pulse signals, respectively, on the basis of a change amount of resistance. In more detail, the first and second capacitors Ca and Cb are implemented in the same manner. A reference voltage applied to the first comparator 211a may be adjusted by a first resistor (not shown). A reference voltage applied to the second comparator 211b may be adjusted by a second resistor (not shown).

As mentioned above, the first and second pulse generators 210a and 210b may output the first and second compare pulse signals VP1a and VP1b, respectively, in response to a reference voltage changed according to a change amount of resistance.

The first gate logic 220 receives the first and second compare pulse signals VP1a and VP1b, respectively, from the first and second pulse generators 210a and 210b. Each of the first and second compare pulse signals VP1a and VP1b may include the same noise signal for temperature characteristics in addition to a signal for a physical change amount of humidity.

The first gate logic 220 may output the first pulse signal VP1 on the basis of a logic operation result on the first and second compare pulse signals VP1a and VP1b. According to a logic operation, a noise signal for temperature characteristics may be removed from the first pulse signal VP1.

Moreover, the pulse amplification unit 230 and the second gate logic 240 may be implemented in the same operating manner as the pulse amplification unit 120 and the gate logic 130 shown in FIG. 3, respectively.

The pulse amplification unit 230 includes a third comparator 231, a third current source 232, a fourth current source 233, a third switch S3a, a fourth switch S4a, a fifth switch S5a, and a third capacitor Cd. The pulse amplification unit 230 outputs a second pulse signal VP2 in response to the first pulse signal VP1.

The second gate logic 240 includes a first logic operation unit 241, a first inverter 242, a second inverter 243, a second logic operation unit 244, and a third logic operation unit 245. The second gate logic 240 outputs a final pulse signal Vout on the basis of a logic operation result on the inverted first pulse signal VP1 and the second pulse signal VP2.

Figure 7:
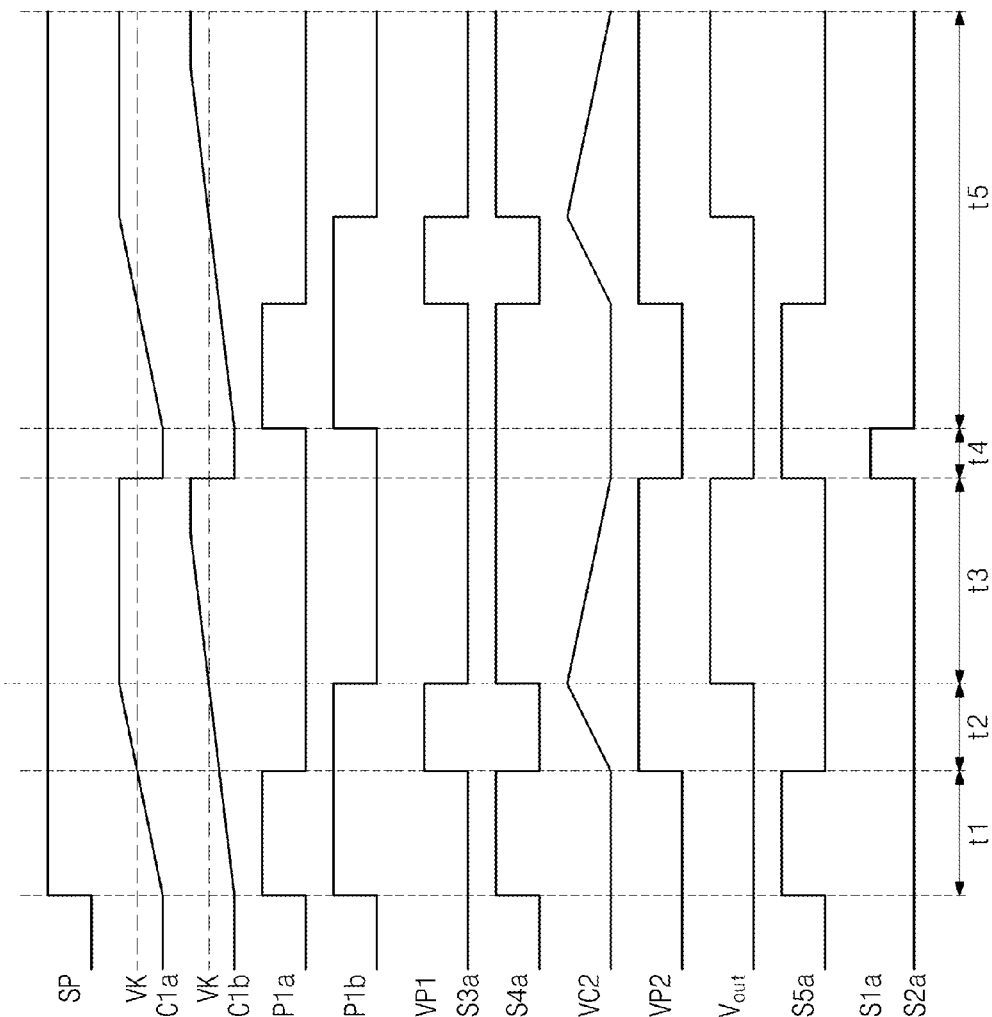
FIG. 7 is a timing diagram illustrating an operation of the pulse generator shown in FIG. 6.

FIG. 7 is a timing diagram illustrating an operation of the pulse generator shown in FIG. 6. Referring to FIGS. 6 and 7, at the first timing t1, the first pulse generator 210a outputs a first compare pulse signal VP1a of a high level in response to a voltage level applied to the first node VC1a. The second pulse generator 210b outputs a second compare pulse signal VP1b in response to a voltage level applied to the second node VC1b.

Moreover, as the fifth switch S5a is turned on in response to a reset signal RST, the pulse amplification unit 230 outputs a second pulse signal VP2 of a low level.

At the second timing t2, the first gate logic 220 outputs a first pulse signal VP1 of a high level. As the first pulse signal VP1 of a high level is applied from the first gate logic 220, the third switch S3a is turned on and the fourth switch S4a is turned off Accordingly, a voltage may be applied to the second node VC2a. Accordingly, the third comparator 231 outputs a second pulse signal VP2 of a high level.

At the third timing t3, as the first pulse signal VP1 is applied from the first gate logic 220, the third switch S3a is turned off and the fourth switch S4a is turned on. Moreover, the second gate logic 240 outputs a final pulse signal Vout of a high level on the basis of a logic operation result on the first and second pulse signals VP1 and VP2.

At the fourth timing t4, as a voltage level of the second node VC2a reaches a ground level, the pulse amplification unit 230 outputs a second pulse signal VP2 of a low level. Additionally, the second gate logic 240 outputs a reset signal RST of a high level so as to reset the first and second pulse generators 210a and 210b and the pulse amplification unit 230. In response to the reset signal RST, the first, second, and fifth switches S1a, S2a, and S5a are turned on.

At the fifth timing t5, the operations of the first to fourth timings t1 to t4 are repeatedly performed.

Figure 8:
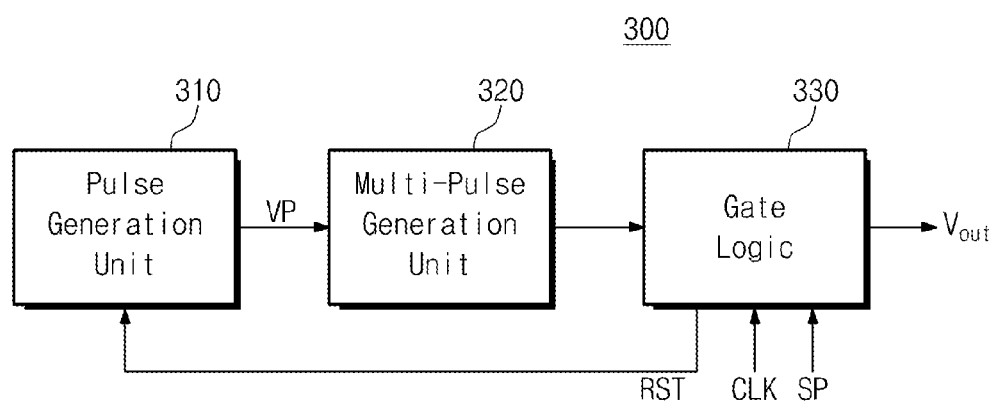
FIG. 8 is a block diagram illustrating a pulse generator according to the third embodiment of the present invention.

FIG. 8 is a block diagram illustrating a pulse generator according to the third embodiment of the present invention. Referring to FIG. 8, the pulse generator 300 includes a pulse generation unit 210, a multi-pulse generator 320, and a gate logic 330.

The pulse generation unit 310 converts an analog signal inputted from a sensor into a pulse signal VP and delivers it to the multi-pulse generator 320.

The multi-pulse generator 320 receives the pulse signal VP from the pulse generation unit 310 and divides the received pulse signal VP into a plurality of forms. For example, the pulse generation unit 310 divides the pulse signal VP into VP/2, VP/4, and VP/8. The multi-pulse generator 320 selects one of the plurality of divided pulse signals and delivers it to the gate logic 330.

The gate logic 330 receives one divided pulse signal from the multi-pulse generator 320. The gate logic 330 outputs a final pulse signal Vout according to a logic operation result in response to a clock signal CLK. Additionally, the gate logic 330 generates a reset signal RST so as to reset the pulse generation unit 310.

Additionally, according to an embodiment of the present invention, the gate logic 330 may adjust a clock signal in response to a pulse signal selected from among the plurality of divided pulse signals.

Figure 9:
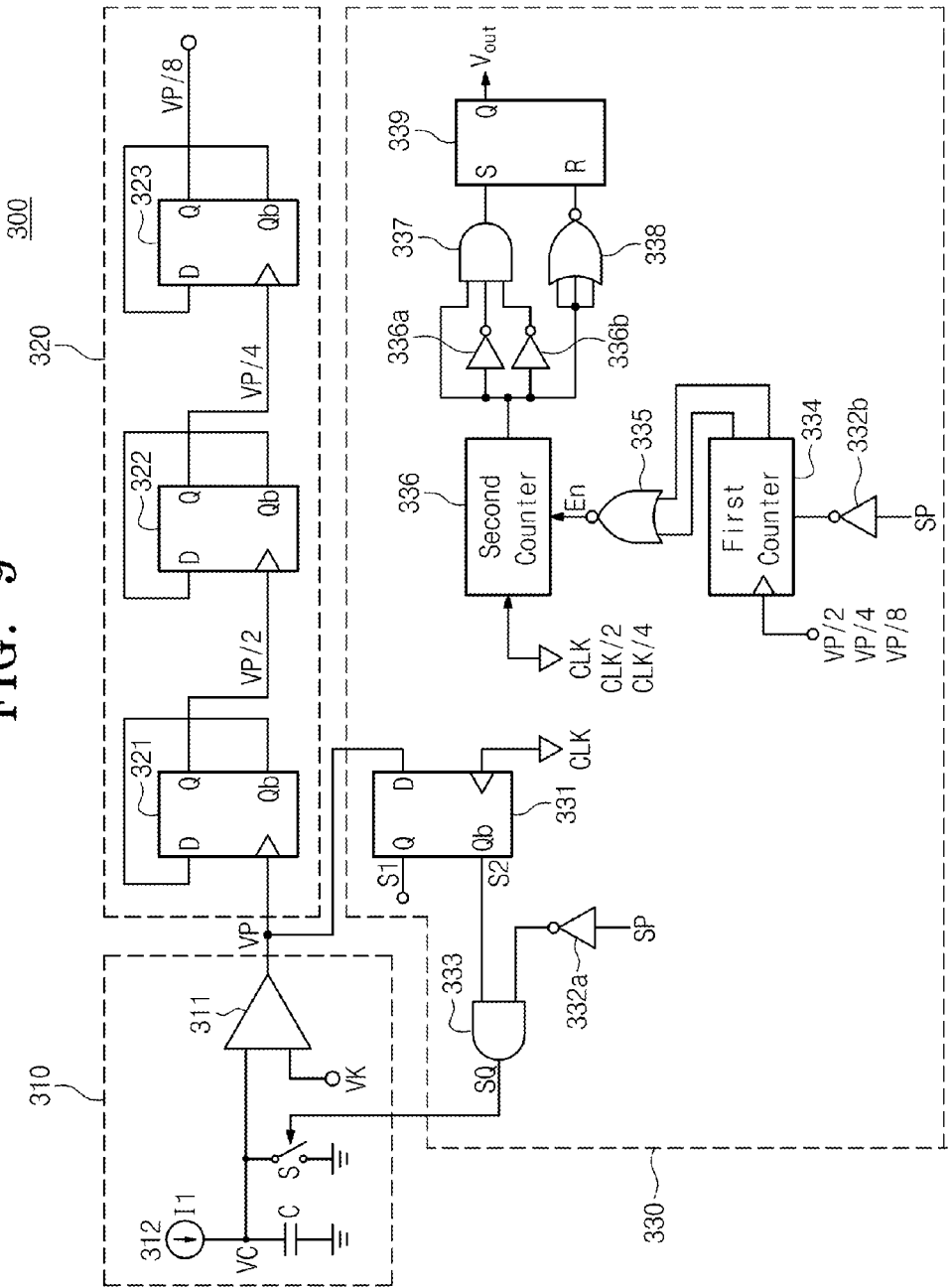
FIG. 9 is a circuit diagram illustrating the pulse generator shown in FIG. 8.

FIG. 9 is a circuit diagram illustrating the pulse generator shown in FIG. 8. Referring to FIG. 9, the pulse generation unit 310 includes a capacitor C, a comparator 311, and a first current source 312. The pulse generation unit 310 may operate with the same structure as the pulse generation unit 110 shown in FIG. 3. The comparator 311 may output a pulse signal VP according to a voltage level charged in the capacitor C.

The multi-pulse generator 320 includes first, second, and third flip-flops 321, 322, and 323 but the number of flip-flops is not limited thereto. Additionally, according to an embodiment of the present invention, the first, second, and third flip-flops 321, 322, and 323 may be D flip-flops.

The multi-pulse generator 320 may divide a first pulse signal VP outputted from the comparator 311 into various forms according to the operation that the switch S is turned on at each predetermined time. In more detail, the first flip-flop 321 divides a second pulse signal VP/2 in response to the first pulse signal VP. The second flip-flop 322 divides a third pulse signal VP/4 in response to a second pulse signal VP/2. The third flip-flop 323 divides a fourth pulse signal VP/8 in response to the third pulse signal VP/4. One pulse signal selected from among a plurality of divided pulse signals may be delivered to the first counter 334.

As mentioned above, the multi-pulse generator 320 receives the first pulse signal VP and outputs it as a plurality of divided forms. However, a pulse signal outputted from the multi-pulse generator 320 includes a time at which the switch S is turned on at each predetermined interval. Accordingly, as the first pulse signal VP is divided more, the multi-pulse generator 320 takes a longer time to measure a pulse width.

The pulse width converter 300 may output a final pulse signal Vout where a tuned-on time of the switch S is removed according to a logic operation based on the gate logic 330.

The gate logic 330 includes a fourth flip-flop 331, a first inverter 332a, a second inverter 332b, a first logic operation unit 333, a first counter 334, a second logic operation unit 335, a second counter 336, third and fourth inverters 336a and 336b, a third logic operation unit 337, a fourth logic operation unit 338, and a fifth flip-flop 339.

The fourth flip-flop 331 receives a pulse signal VP from the comparator 311. The fourth flip-flop 331 outputs a switch signal Qb to the first logic operation unit 333 in response to a clock signal CLK received from the outside. According to an embodiment of the present invention, the fourth flip-flop 331 may be a reset flip-flop for resetting the pulse generation unit 310.

The first logic operation unit 333 receives a switch signal Qb from the fourth flip-flop 331. Additionally, the first logic operation unit 333 receives an inverted start pulse signal SP from the first inverter 332. According to an embodiment of the present invention, the first logic operation unit 333 may be an And gate. The first logic operation unit 333 controls an operation of the switch S in response to received signals.

The first counter 334 receives one pulse signal selected from an inverted start pulse signal SP from the second inverter 332b and a plurality of divided pulse signals from the multi-pulse generator 320. According to an embodiment of the present invention, the first counter 334 may be a 2-bit counter. The first counter 334 transmits a 2-bit signal to the second logic operation unit 335 in response to the selected one pulse signal.

The second logic operation unit 335 receives a 2-bit signal from the first counter 334. If a value of the received 2-bit signal is 1, the second logic operation unit 335 outputs an enable signal En. A bit value of a first signal may be "00".

The second counter 336 receives a clock signal CLK from the outside and an enable signal En from the second logic operation unit 335. According to an embodiment of the present invention, the second counter 336 may be a 3-bit counter. The second counter 336 may output a 3-bit signal in response to a clock signal CLK.

Moreover, according to an embodiment of the present invention, the second counter 336 receives a changed clock signal according to a pulse signal outputted from the multi-pulse generator 320. For example, upon receiving an enable signal En for a second pulse signal VP/2, the second counter 336 outputs a 3-bit signal in response to a first clock signal CLK. According to another embodiment of the present invention, upon receiving an enable signal En for a third pulse signal VP/4, the second counter 336 outputs a 3-bit signal in response to a second clock signal CLK/2. As mentioned above, the clock signal may be adjusted according to a pulse signal received by the second counter 336.

The fifth flip-flop 339 outputs a final pulse signal Vout in response to first and second output signals received from the third and fourth logic operation units 337 and 338. According to an embodiment of the present invention, the fifth flip-flop 339 may be an output flip-flop implemented with an SR flip-flop.

In more detail, if a value of a 3-bit signal received from the second counter 336 is a first signal, the third logic operation unit 337 applies a first output signal to an S terminal of the fifth flip-flop 339. "100" may be applied as a bit value of a first signal.

On the other hand, if a value of a 3-bit signal received from the second counter 336 is a second signal, the fourth logic operation unit 338 applies a second output signal to an R terminal of the fifth flip-flop 339. "000" may be applied as a bit value of a second signal.

Additionally, according to an embodiment of the present invention, if a value of a 3-bit signal outputted from the second counter 336 is first and second signals, the fifth flip-flop 339 operates. As mentioned above, the fifth flip-flop 339 may output a final pulse signal Vout excluding a turn-on time of the switch S in response to a 3-bit signal outputted from the second counter 336.

Figure 10:
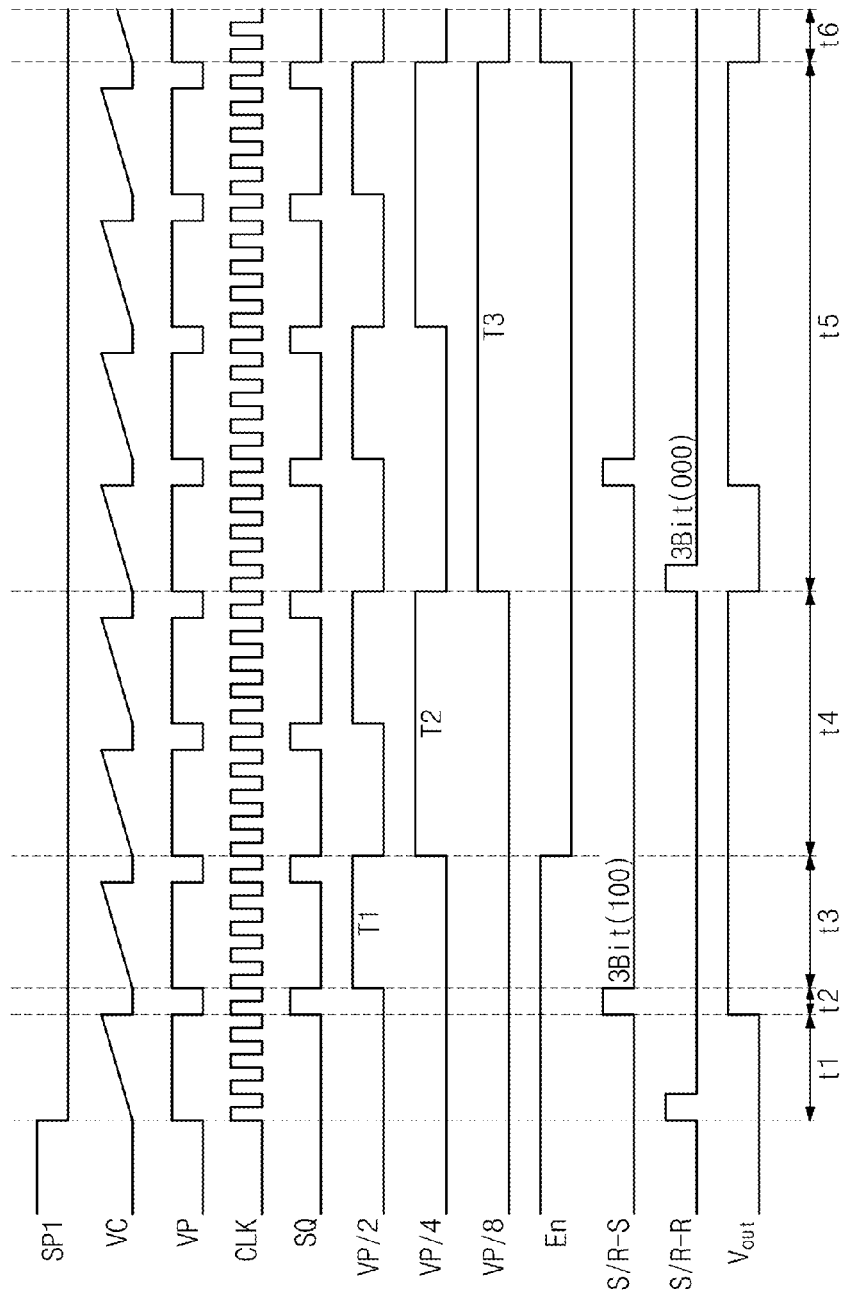
FIG. 10 is a timing diagram illustrating an operation of the pulse generator shown in FIG. 9.

FIG. 10 is a timing diagram illustrating an operation of the pulse generator shown in FIG. 9. Referring to FIGS. 9 and 10, at the first timing t1, the pulse generation unit 310 generates a first pulse signal VP of a high level.

At the second timing t2, the switch S is turned on in response to a switch signal SQ outputted from the first logic operation unit 333. The switch signal SQ maintains a high level state during a clock signal CLK of one period.

At the third to fifth timings t3, t4, and t5, the multi-pulse generation unit 320 generates a second pulse signal VP/2, a third pulse signal VP/4, and a fourth pulse signal VP/8, respectively. As shown in FIG. 10, each divided pulse signal outputted from the multi-pulse generator 320 includes a turn-on time of the switch S.

For example, the second pulse signal VP/2 includes a time at which the switch S is turned on one time. The third pulse signal VP/4 includes a time at which the switch is turned on two times. The fourth pulse signal VP/8 includes a time at which the switch is turned on four times.

The pulse width converter 300 outputs a final pulse signal Vout excluding a turn-on time of the switch S in order to reduce a measurement time of a pulse width. For example, components of the gate logic shown in FIG. 10 operate when the first counter 334 receives the second pulse signal VP/2. According to an embodiment of the present invention, when the second pulse signal VP/2 is used, the final pulse signal Vout may be outputted as a four time amplified signal.

At the second timing t2, when a 3-bit value of a first signal is outputted from the second counter 336, the fifth flip-flop 399 outputs a final pulse signal Vout of a high level. The 3-bit value of the first signal may be "100".

Additionally, at the fifth timing t5, as a 3-bit value of a second signal is outputted from the second counter 336, when the third bit value of the first signal is outputted from the second counter 336, the fifth flip-flop 399 outputs a final pulse signal Vout of a low level. The 3-bit value of the second signal is "000".

As mentioned above, the gate logic 330 may set the first flip-flop 339 to operate with a 3-bit value according to the first and second signals. Therefore, the pulse generator 300 may output a final pulse signal Vout excluding a turn-on time of the switch S.

Figure 11:
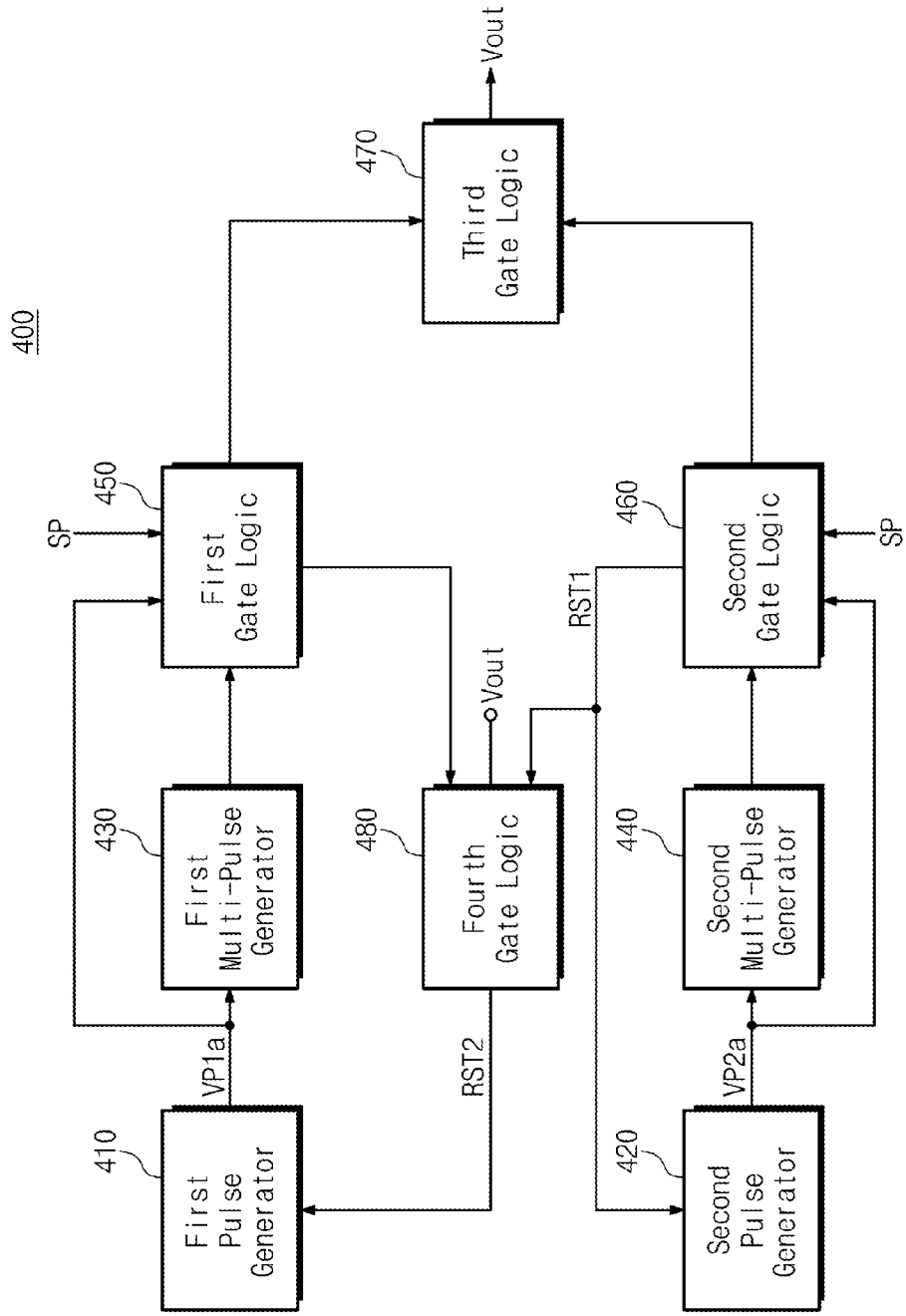
FIG. 11 is a block diagram illustrating a pulse generator according to a fourth embodiment of the present invention.

FIG. 11 is a block diagram illustrating a pulse generator according to a fourth embodiment of the present invention. Referring to FIG. 11, the pulse generator 400 includes first and second pulse generators 410 and 420, first and second multi-pulse generators 430 and 440, and first to fourth gate logics 450, 460, 470, and 480.

The pulse generator 400 shown in FIG. 11 may output a more accurate final pulse signal than the pulse generator 300 shown in FIG. 8. In more detail, referring to the pulse generator 200 shown in FIG. 5, the pulse generator 400 may compare a change amount of a first sensor included in the first pulse generator 410 and a change amount of a second sensor included in the second pulse generator 420. By comparing the change amounts of the first and second sensors, the pulse generator 400 may determines a final change amount of a sensor. According to an embodiment of the present invention, at least one of the first and second sensors may be a reference sensor.

The first gate logic 450 receives a first multi-pulse signal divided from the first multi-pulse generator 430. The second gate logic 460 receives a second multi-pulse signal divided from the second multi-pulse generator 440. Additionally, the third gate logic 470 receives the first and second pulse signals outputted from the first and second gate logics 450 and 460 and perform a logic operation on them.

As mentioned above, the pulse generator 400 may obtain an accurate output value for a desired sensor value. Although a method of differentiating each change amount outputted from sensors through a logic operation is described, the present invention is not limited thereto.

Figure 12:
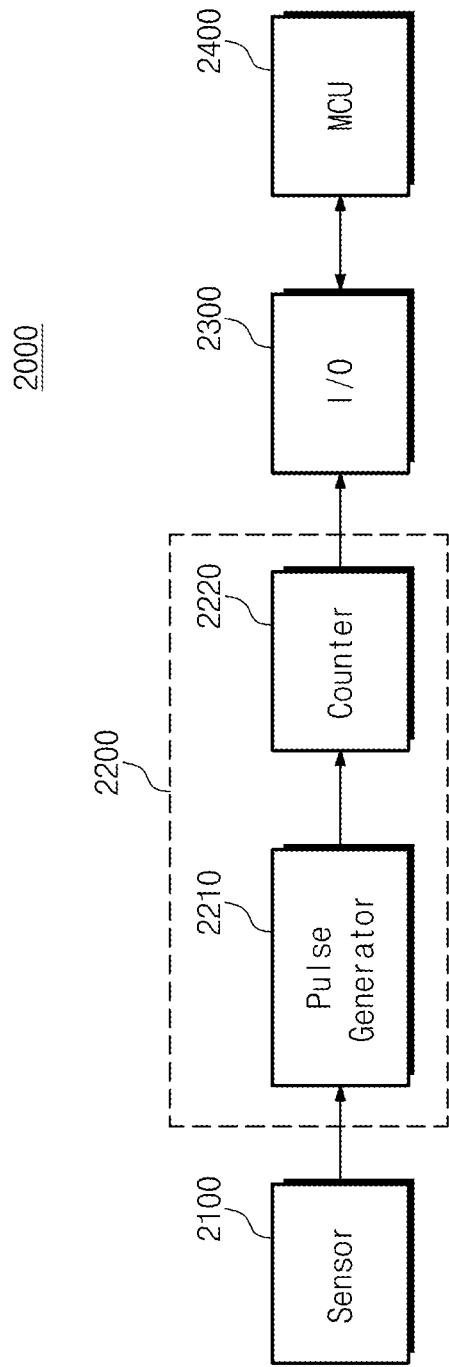
FIG. 12 is a block diagram illustrating an electronic system including an analog-digital (A/D) converter according to an embodiment of the present invention.

FIG. 12 is a block diagram illustrating an electronic system including an analog-digital (A/D) converter according to an embodiment of the present invention. Referring to FIG. 12, the electronic system 2000 includes a sensor 2100, an A/D converter 2200, an input/output device 2300, and a micro control unit 2400.

The A/D converter 2200 includes a pulse generator 2210 and a counter 2220. The A/D converter 2200 digitizes an analog signal detected from the sensor 2100. Especially, the pulse generator 2210 may delay a pulse width for the detected analog signal by a predetermined time. Additionally, the pulse generator 2210 may amplify a pulse signal for an analog signal through a multiplexing method.

According to an embodiment of the present invention, a pulse signal outputted from the pulse generator 2210 may be directly delivered to the micro control unit 2400. The micro control unit 2400 may directly receive a pulse signal from the pulse generator 2210 and then may perform an A/D conversion on the received pulse signal.

The input/output device 2300 transmits a digital signal received from the A/D converter 2200 to the micro control unit 2400. The micro control unit 2400 performs a role of a processor for controlling a system in response to the transmitted digital signal.

According to an embodiment of the present invention, a pulse generator may increase a pulse width stably even with a small amount of physical change of a sensor through a pulse amplification unit and a multi-pulse generator.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A pulse generator comprising:
a pulse generation unit receiving an analog signal and generating a first pulse signal in response to a comparison result of a voltage level applied to a first node and a reference voltage according to the received analog signal;
a pulse amplification unit generating a second pulse signal having a wider pulse width than the first pulse signal according to a comparison result of a voltage level applied to a second node and a ground voltage, in response to the first pulse signal; and
a gate logic outputting a final pulse signal as a signal for digital conversion by performing a logic operation on the first and second pulse signals,
wherein after a level of the first pulse signal is shifted, the pulse amplification unit amplifies a pulse width of the second pulse signal for a predetermined time until the a voltage level of the second node reaches the ground voltage.

2. The pulse generator of claim 1, wherein the gate logic generates a reset signal for initializing the pulse generation unit and the pulse amplification unit.

3. The pulse generator of claim 2, wherein the first pulse generation unit comprises:
a first current source generating a first reference current and applying the generated first reference current to the first node;
a first capacitor charging a voltage on the basis of the first reference current applied to the first node;
a first comparator outputting the first pulse signal by comparing a voltage level of the first node and a voltage level of the reference voltage; and
a first switch resetting the voltage level of the first node.

4. The pulse generator of claim 3, wherein the pulse amplification unit comprises:
a second current source applying a second reference current to the second node in response to the first pulse signal;
a second capacitor charging a voltage on the basis of the second reference current applied to the second node; and
a third current source discharging the voltage level of the second node in response to a third reference current, as the level of the first pulse signal is shifted; and
a second comparator outputting the second pulse signal by comparing the voltage level of the second node and a level of the ground voltage.

5. The pulse generator of claim 4, wherein the pulse amplification unit comprises second and third switches,
wherein the second switch is turned on in response to the first pulse signal and the third switch is turned on as the level of the first pulse signal is shifted.

6. The pulse generator of claim 5, wherein the pulse amplification unit further comprises a fourth switch resetting a voltage of the second node in response to the reset signal.

7. The pulse generator of claim 2, wherein the logic gate comprises:
a first logic operation unit outputting the final pulse signal generated on the basis of a logic operation of an inverted first pulse signal and the second pulse signal; and
a second logic operation unit outputting the reset signal generated on the basis of a logic operation of the inverted first pulse signal, an inverted final pulse signal, and a start pulse signal.

8. The pulse generator of claim 1, wherein the pulse generation unit comprises first and second sensors, further comprising:
a first pulse generator outputting a first compare pulse signal in response to an analog signal provided from the first sensor;
a second pulse generator outputting a second compare pulse signal in response to an analog signal provided from the second sensor; and
a compare gate logic outputting the first pulse signal on the basis of a logic operation of the first and second compare pulse signals,
wherein at least one of the first and second sensors is a reference sensor.

9. The pulse generator of claim 8, wherein the compare gate logic is an exclusive OR gate.

10. The pulse generator of claim 8, wherein the first pulse generator comprises a first switch and the second pulse generator comprises a second switch,
wherein the first and second switches are turned on in response to the reset signal.

11. A pulse generator comprising:
a pulse generation unit generating a pulse signal in response to an analog signal provided from a sensor;
a multi-pulse generator outputting a plurality of divided pulse signals in response to the pulse signal; and
a gate logic selecting one pulse signal from among the plurality of divided pulse signals and outputting a final pulse signal generated on the basis of a logic operation on the selected pulse signal as a signal for digital conversion,
wherein the multi-pulse generator comprises a plurality of flip-flops generating the plurality of divided pulse signals in response to the pulse signal, and
wherein the gate logic comprises:
a first counter outputting a first counter signal in response to a pulse signal selected from among the plurality of divided signals;
a second counter receiving an enable signal generated on the basis of a logic operation on the first counter signal and outputting a second counter signal in response to the received enable signal and a clock signal; and
an output flip-flop generating the final pulse signal in response to first and second output signals generated on the basis of a logic operation on the second counter signal.

12. The pulse generator of claim 11, wherein the gate logic comprises a reset flip-flop for resetting the pulse generation unit.

* * * * *